(12) United States Patent
Nishiyama

(10) Patent No.: US 6,862,305 B2
(45) Date of Patent: Mar. 1, 2005

(54) SEMICONDUCTOR LASER DEVICE

(75) Inventor: Nobuhiro Nishiyama, Habikino (JP)

(73) Assignee: Sharp Kabushiki Kaisha, Osaka (JP)

( * ) Notice: Subject to any disclaimer, the term of this patent is extended or adjusted under 35 U.S.C. 154(b) by 524 days.

(21) Appl. No.: 10/006,297

(22) Filed: Dec. 6, 2001

(65) Prior Publication Data

US 2002/0071461 A1 Jun. 13, 2002

(30) Foreign Application Priority Data

Dec. 7, 2000 (JP) ........................................ 2000-372275

(51) Int. Cl.[7] .............................................. H01S 3/04
(52) U.S. Cl. .......................................... 372/36; 372/34
(58) Field of Search ................................ 372/34–36, 43

(56) References Cited

U.S. PATENT DOCUMENTS

| 5,309,460 A | * | 5/1994 | Fujimaki et al. | ............. 372/36 |
| 5,327,443 A | * | 7/1994 | Tanaka et al. | ................ 372/36 |
| 5,355,385 A | * | 10/1994 | Amano et al. | ................ 372/49 |
| 5,444,726 A | * | 8/1995 | Kitamura et al. | ............. 372/36 |
| 5,485,479 A | * | 1/1996 | Kitamura et al. | ............. 372/43 |
| 5,590,144 A | * | 12/1996 | Kitamura et al. | ............. 372/36 |
| 5,614,735 A | * | 3/1997 | Kitamura et al. | ............. 257/99 |
| 5,825,794 A | * | 10/1998 | Ogino et al. | .................. 372/36 |
| 6,171,877 B1 | * | 1/2001 | Webb | .......................... 438/25 |

FOREIGN PATENT DOCUMENTS

| JP | 02266584 A | 10/1990 |
| JP | 6-45691 | 2/1994 |
| JP | 07170019 A | 7/1995 |
| JP | 07335982 A | 12/1995 |
| JP | 10209551 A | 8/1998 |

* cited by examiner

Primary Examiner—Minsun Oh Harvey
Assistant Examiner—Phillip Nguyen
(74) Attorney, Agent, or Firm—Morrison & Foerster LLP

(57) ABSTRACT

A semiconductor laser device according to the present invention includes a first lead portion having a mounting portion on which a semiconductor laser chip is mounted, a second lead portion for an electrode, and a resin portion for fixing the first and second lead portions. The second lead portion is provided with an engagement portion engaging with the resin portion in the longitudinal direction of the second lead portion, and extends straight within the resin portion.

8 Claims, 3 Drawing Sheets

SEMICONDUCTOR LASER DEVICE

BACKGROUND OF THE INVENTION

1. Field of the Invention

The present invention relates to a semiconductor laser device having a lead frame on which a semiconductor laser chip is mounted and achieving superior mass production.

2. Description of the Background Art

A semiconductor laser device having a lead frame on which a semiconductor laser chip is mounted is called a frame laser. FIGS. 2 to 4A, 4B show examples of conventional frame lasers.

FIG. 2 shows a frame laser disclosed in Japanese Patent Laying-Open No. 2-266584, in which a first lead portion 20 on which a laser chip 24 is mounted extends approximately straight, and second lead portions 21, 22, which are to be electrodes, are bent within mold resin 23.

FIG. 3 shows a frame laser disclosed in Japanese Patent Laying-Open No. 6-45691, in which a tip end of a first lead portion 30 on which a laser element 34 is mounted is widened in the widthwise direction. This allows heat radiation to be superior to that of the example shown in FIG. 2. Second lead portions 31, 32, which are to be electrodes, extend straight within an insulation frame 33.

FIGS. 4A and 4B show a frame laser disclosed in Japanese Patent Laying-Open No. 10-209551, in which a first lead portion 40 on which a laser chip 44 is mounted extends approximately straight. This inhibits efficient release of the heat generated in the semiconductor laser, so that a heat radiating plate 45 is provided on the back side of first lead portion 40.

Moreover, the outer shape of mold resin 43 for fixing the leads is formed to have a partially-cut circular shape, to facilitate adjustment and to prevent the mold resin from rotating after adjustment. Second lead portions 41 and 42, which are to be electrodes, extend straight within mold resin 43.

In the example shown in FIG. 2, first lead portion 20 extends straight, so that heat generated in the semiconductor laser cannot efficiently be released, degrading reliability. In addition, the tip ends of second lead portions 21, 22 are bent, thereby increasing the size of the frame laser in the direction of a width W.

In the example shown in FIG. 3, heat radiation can be improved compared to the example shown in FIG. 2, as described above. However, second lead portions 31, 32 extend straight within insulation frame 33, resulting that second lead portions 31, 32 may come off because of softened insulation frame 33 when second lead portions 31, 32 are soldered to an external circuit. Moreover, second lead portions 31, 32 easily move and hence they may easily change their orientation.

In the example shown in FIGS. 4A and 4B, though a similar problem may occur such as coming off of second lead portions 41, 42, as in the case with the example shown in FIG. 3, a portion of mold resin 43 covering second lead portions 41, 42 is made thicker and a convex portion 46 is provided, so that the problem such as coming off of second lead portions 41, 42 may be prevented to some degree.

However, provision of convex portion 46 alone cannot sufficiently prevent coming-off or the like of second lead portions 41, 42. Moreover, in the example shown in FIGS. 4A and 4B, the use of a heat radiating member such as a copper block is required, which lowers productivity and increases cost.

SUMMARY OF THE INVENTION

The present invention is made to solve the problems described above. One object of the present invention is to provide a semiconductor laser device that can prevent coming-off or the like of a lead frame when the lead frame is soldered to an external circuit, and that is compact in size.

Another object of the present invention is to provide a semiconductor laser device that can enhance heat radiation without increase of manufacturing cost, and that is compact in size.

According to an aspect of the present invention, a semiconductor laser device includes a first lead portion having a mounting portion on which a semiconductor laser chip is mounted; a second lead portion for an electrode; and a resin portion fixing the first and second lead portions. The second lead portion is provided with an engagement portion engaging with the resin portion in a longitudinal direction (extending direction) of the second lead portion, and extends straight within the resin portion.

By thus providing the second lead portion with the engagement portion, the engagement between the second lead portion and resin portion can be maintained even if the resin portion is softened when the second lead portion is soldered to an external circuit, preventing coming-off or the like of the second lead portion. In addition, the second lead portion extends straight within the resin portion so that the size of the semiconductor laser device can be reduced in the direction of width (the direction orthogonal to the extending direction of the second lead portion), compared to the example in which the second lead portion is bent within the resin portion. Therefore, the semiconductor laser device can be made smaller in size.

The engagement portion includes a wide portion formed by locally expanding a width of the second lead portion within the resin portion.

Provision of such a wide portion allows the resin portion to be in engagement with the wide portion, effectively preventing coming-off or the like of the second portion. Moreover, the area in which wire bonding is performed can be enlarged, facilitating wire bonding.

Preferably, a third lead portion for heat radiation is provided extending on the same side as the second lead portion from the resin portion.

Thus, heat radiation can significantly be improved without much increase of the size of the semiconductor laser device. In addition, the lead frame is used as a heat radiating member, so that the heat radiating member can be provided at a low cost, avoiding increase of the manufacturing cost.

Preferably, an outer circumference of the resin portion has a circular shape with the semiconductor laser chip arranged at the center. The "circular" here means a circular shape as a whole, and includes an approximate circular shape partially having a cut portion, a chamfered portion or the like.

By forming the outer circumference of the resin portion to have a circular shape, the laser chip can be rotated with respect to an external optical system when it is mounted on an optical pickup, so that the direction of expansion of a far field image, the direction of polarization of laser light and the like can easily be adjusted.

The resin portion has a window portion through which light emitted from the semiconductor laser chip passes. This can protect the laser chip while blocking reflection or obstruction of laser light, preventing occurrence of wire being cut, die being peeled off and so forth in the laser chip due to an external force applied at the time of e.g. assembly.

Preferably, an outer circumference of the resin portion is provided with a cut portion for stopping rotation. This can prevent the semiconductor laser device from being rotated and displaced after adjustment of the position of the semiconductor laser device.

Preferably, the mounting portion of the semiconductor laser chip in the first lead portion is made wider than the first lead portion excluding the mounting portion. This can improve head radiation.

According to another aspect of the present invention, a semiconductor laser device includes a first lead portion having a mounting portion on which a semiconductor laser chip is mounted; a second lead portion for an electrode; a third lead portion for heat radiation; and a resin portion fixing the first, second and third lead portions. The second and third lead portions extend on the same side from the resin portion.

By thus providing the third lead portion for heat radiation that extends from the resign portion, heat radiation can significantly be enhanced. Here, a lead frame may be used as a heat radiating member to prepare the heat radiating member at a lower cost compared to the conventional example in which the head radiating member such as a copper block was separately prepared, and hence productivity can be improved. Therefore, the manufacturing cost can be lowered. The second and third lead portions extend on the same side of the resin portion, so that the size of the semiconductor laser device is hardly increased in the width direction, resulting in a compact semiconductor laser device.

The foregoing and other objects, features, aspects and advantages of the present invention will become more apparent from the following detailed description of the present invention when taken in conjunction with the accompanying drawings.

DESCRIPTION OF THE PREFERRED EMBODIMENT

Figure 1A:
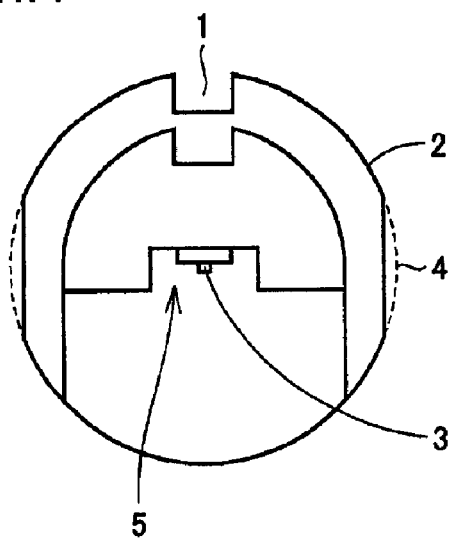
FIG. 1A is a plan view of a semiconductor laser device according to one embodiment of the present invention.
Figure 1B:
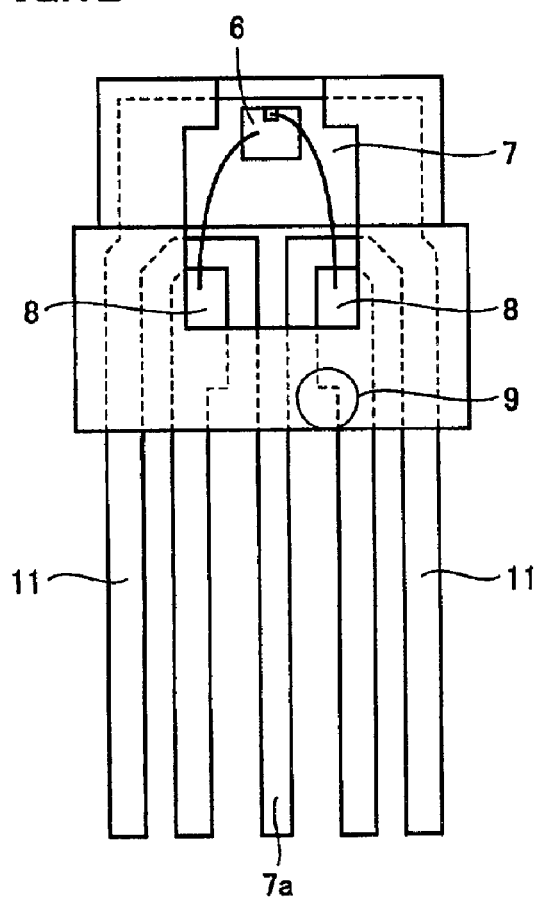
FIG. 1B is a front view of the semiconductor laser device shown in FIG. 1A.

An embodiment of the present invention will be described below with reference to FIGS. 1A to 1C. FIG. 1A is a plan view of a semiconductor laser device (a frame laser) according to the present embodiment. FIG. 1B is a front view and FIG. 1C is a side view of the same.

Figure 1C:
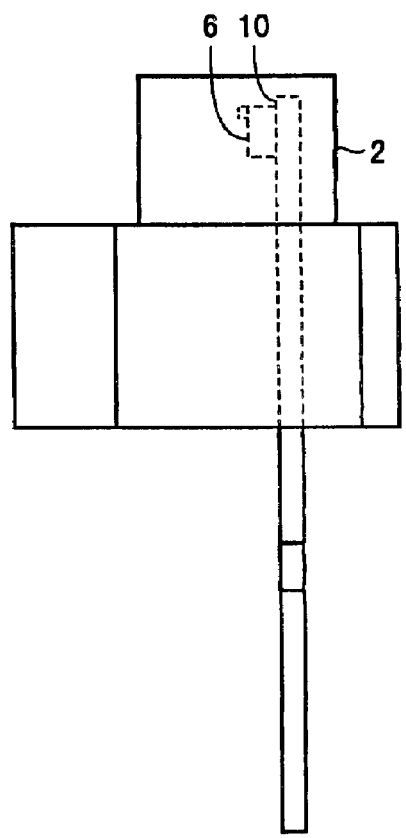
FIG. 1C is a side view of the semiconductor laser device shown in FIG. 1A
Figure 2:
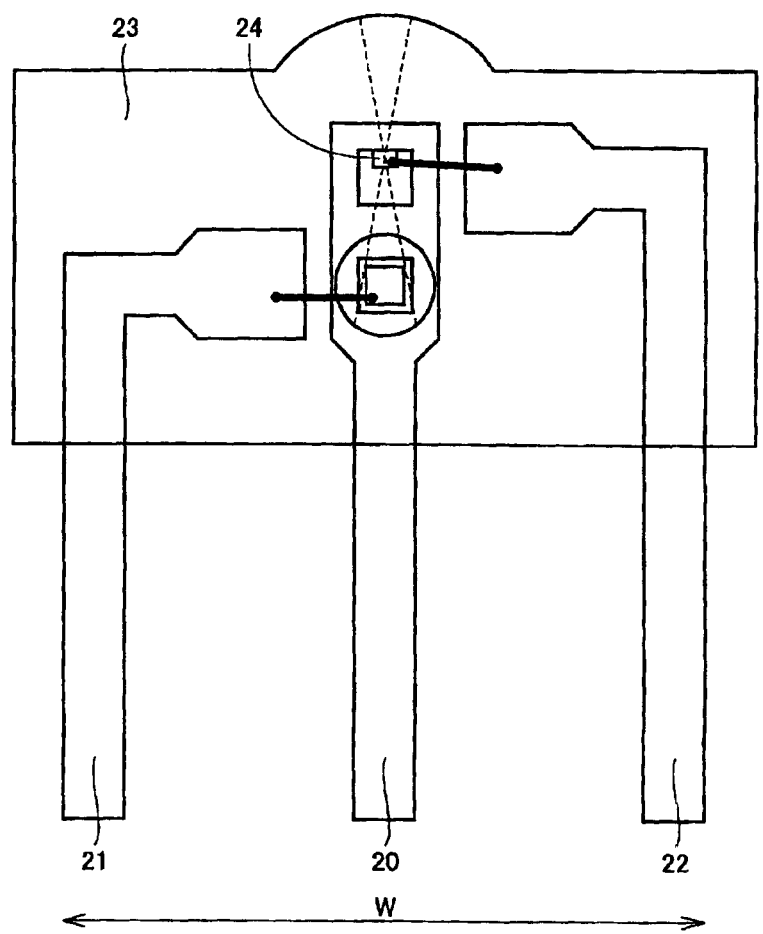
FIG. 2 is a front view of an example of the conventional semiconductor laser device.
Figure 3:
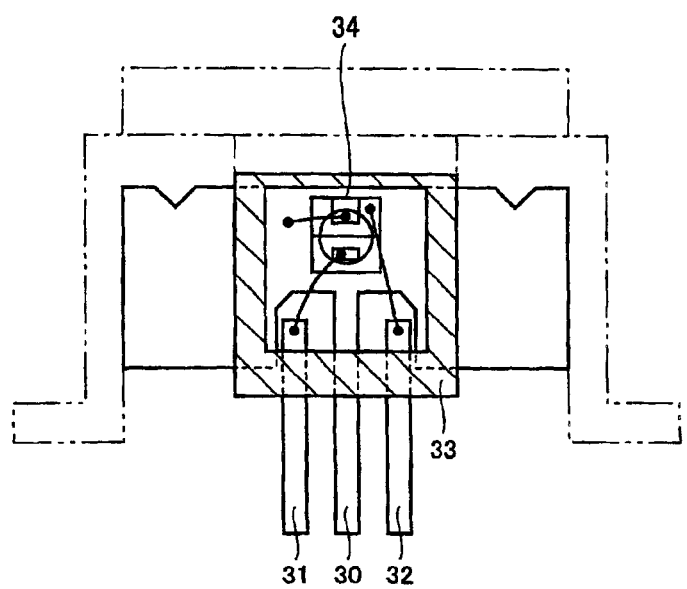
FIG. 3 is a front view of another example of the conventional semiconductor laser device.
Figure 4A:
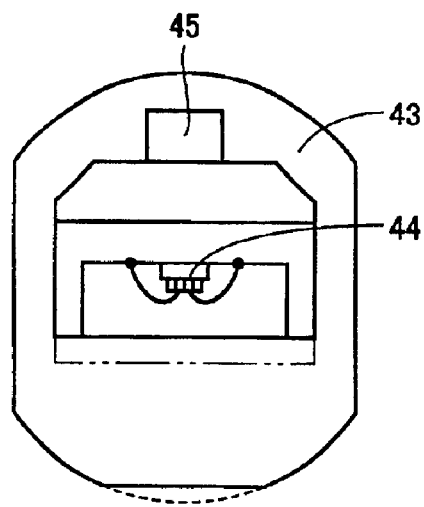
FIG. 4A is a plan view of a further example of the conventional semiconductor laser device.
Figure 4B:
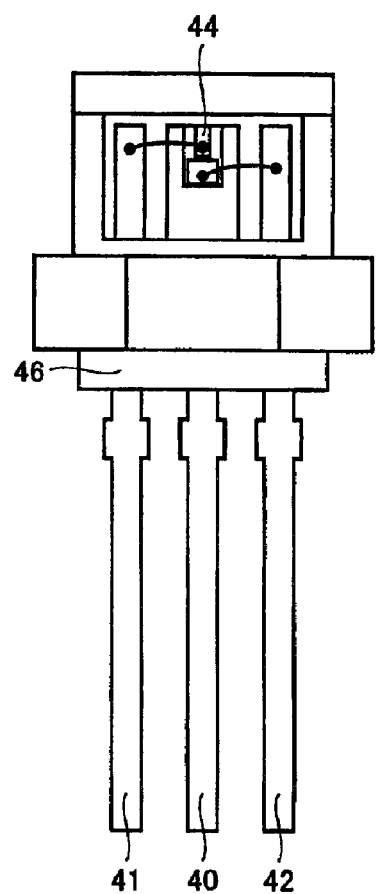
FIG. 4B is a front view of the semiconductor laser device shown in FIG. 4A.

The semiconductor laser device according to the present embodiment includes, as shown in FIGS. 1A to 1C, a resin portion 2 for fixing a lead portion, a semiconductor laser chip 3, a sub mounting portion 6 for heat radiation, and first to third lead portions 7, 8 and 11.

Semiconductor laser chip 3 is mounted onto sub mounting portion 6 with a light receiving element for monitoring integrated therein. A first lead portion (a lead for die-bonding of an LD chip) 7 having a mounting portion on which sub-mount-integrated semiconductor laser chip 3 is mounted and a second lead portion (lead for electrode) 8 for electrical connection are fixed by resin portion 2.

An engagement portion 9 engaging with resin portion 2 in the longitudinal direction (extending direction) of second lead portion 8 is provided at second lead portion 8. This allows an engagement state between resin portion 2 and engagement portion 9 to be maintained when the second lead portion 8 is soldered to an external circuit, so that second lead portion 8 can effectively be prevented from a problem such as coming off.

Engagement portion 9 is constituted by a wide portion formed by locally expanding the width of second lead portion 8 within resin portion 2. Thus, coming-off or the like of second lead portion 8 can effectively prevented, and also the area where wire bonding is performed can be expanded so that wire bonding is facilitated.

It is noted that engagement portion 9 having any arbitrary shape other than the wide portion described above may be employed, as long as it protrudes in the longitudinal direction of second lead portion 8 to engage with resin portion 2 in the longitudinal direction of second lead portion 8.

Moreover, as shown in FIG. 1B, second lead portion 8 extends straight within resin portion 2. Thus, the size of the semiconductor laser device can be reduced in the width direction (the direction orthogonal to the extending direction of second lead portion 8), compared to the example in which the lead portion is bent within the resin portion. Therefore, the semiconductor laser device can be made smaller in size.

Furthermore, as shown in FIG. 1B, the mounting portion of semiconductor laser chip 3 in first lead portion 7 is formed to be wider than the other part of first lead portion 7 excluding the mounting portion. Therefore, heat radiation can be improved.

In addition, a heat radiating portion 7a extending from the mounting portion of semiconductor laser chip 3 and extending out from resin portion 2 is provided at first lead portion 7. Thus, heat can be released to an external circuit, further improving head radiation. Heat radiating portion 7a also serves as a portion for electrical connection to the external circuit.

Furthermore, as shown in FIG. 1B, a third lead portion 11 for heat radiation is provided extending on the same side as second lead portion 8 from resin portion 2. Third lead portion 11 extends along second lead portion 8 on both sides of second lead portion 8, and has a width equal to that of second lead portion 8.

Provision of such a third lead portion 11 allows significant improvement in heat radiation without much enlargement of the semiconductor laser device in the width direction. Thus, a semiconductor laser element having a poor temperature property, e.g. an InGaAlP/GaAs-based semiconductor laser chip that emits red laser light or an InGaAsP/InP, InGaAlN-based semiconductor laser chip may also be used as a frame laser.

Here, a temperature property T0 is a parameter indicating a temperature dependency of an oscillation threshold Ith. Assuming that the temperature used is T, Ith can be approximated by the equation (1) below.

$$Ith = \exp(aT/T0) \qquad (1),$$

wherein a is a proportional constant. In the equation (1) above, as T0 increases, the temperature variation Ith becomes smaller, resulting in a better temperature property. If T0 is equal to or higher than 130K (Kelvin), heat radiating portion 7a alone is enough, whereas if T0 is lower than that, a heat radiating means such as third lead portion 11 is required. Incidentally, T0 of a GaAlAs/GaAs-based infrared semiconductor laser element is in the range between 130K and 150K.

As shown in FIG. 1B, the use of the lead frame as a heat radiating member lowers cost for provision of the heat radiating member and improves productivity, compared to the conventional example in which the heat radiating member such as a copper block was separately prepared. Thus, increase of the manufacturing cost can be avoided.

Moreover, by providing second and third lead portions 8, 11 to extend on the same side of resin portion 2, the size of the semiconductor laser device is hardly increased, resulting in a compact semiconductor laser device.

First to third lead portions 7, 8 and 11 described above are fixed by resin portion 2, and constitute a linear frame portion 10 as shown in FIG. 1C.

The outer circumference of resin portion 2 is made to be circular with a semiconductor laser chip 3 arranged at the center thereof, as shown in FIG. 1A. This allows the laser chip to rotate with respect to an external optical system when mounted onto an optical pickup, thereby facilitating adjustment of the extending direction of a far field image or the polarizing direction of the laser light.

A cut portion 1 for stopping rotation is provided at the outer circumference of resin portion 2, as shown in FIG. 1A. Cut portion 1 is used for locating the semiconductor laser device and for preventing rotation of the semiconductor laser device.

In the example shown in FIG. 1A, cut portion 1 is formed by a concave portion with a U-shaped cross section. In such a case, a protrusion that fits into cut portion 1 may be provided at a corresponding portion on the side to which the semiconductor laser device is attached.

Resin portion 2 has a chamfered portion (cut portion) 4 on both sides, as shown in FIG. 1A. In the example shown in FIG. 1A, chamfered portion 4 is formed by a flat plane. Chamfered portion 4 is also used for locating the semiconductor laser device.

When the lead and frame are fixed by resin, an upper mold and a lower mold come to be in contact at the plane of the lead. At that time, resin comes into the gap between the upper and lower molds, causing a burr. Chamfered portion 4 described above also has a function of removing the burr.

As shown in FIG. 1B, resin portion 2 has, at a portion where light emitted from semiconductor laser chip 3 passes through (an optical path), a window portion 5 and an opening portion for die bonding and wire bonding, and covers the outer circumference of the semiconductor laser device excluding the portions described above.

This can eliminate reflection and obstruction of laser light, and also can prevent semiconductor laser chip 3 from being in contact with a tool or an external circuit, which causes wire being cut, die being peeled off and the like, when the semiconductor laser device is adjusted and installed.

According to an aspect of the present invention, the second lead portion is provided with the engagement portion, so that coming-off or the like of the second lead portion can effectively be prevented when the second lead portion is soldered to an external circuit. Moreover, the second lead portion extends straight within the resin portion, resulting in a compact semiconductor laser device. Therefore, coming-off or the like of the lead portion can effectively be prevented, while the semiconductor laser device is reduced in size.

According to another aspect of the present invention, the third lead portion for heat radiation is provided, so that the heat radiation can significantly be improved, and the manufacturing cost can be reduced. Furthermore, the second and third lead portions extend on the same side of the resin portion, resulting in a compact semiconductor laser device. Therefore, heat radiation can be improved while the size and manufacturing cost of the semiconductor laser device are reduced.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor laser device, comprising:
   a first lead portion having a mounting portion on which a semiconductor laser chip is mounted;
   a second lead portion for an electrode;
   a third lead portion having a first side portion and a second side portion, the first side portion disposed to one side of the second lead portion and the second side portion disposed to another side of the second lead portion; and
   a resin portion fixing said first, second and third lead portions;
   said second lead portion being provided with an engagement portion engaging with said resin portion in a longitudinal direction of said second lead portion, and extending straight within said resin portion.

2. The semiconductor laser device according to claim 1, wherein said engagement portion includes a wide portion formed by locally expanding a width of said second lead portion within said resin portion.

3. The semiconductor laser device according to claim 1, wherein:
   said third lead portion extends from said resin portion on a same side as said second lead portion.

4. The semiconductor laser device according to claim 1, wherein an outer circumference of said resin portion has a circular shape with said semiconductor laser chip arranged at a center.

5. The semiconductor laser device according to claim 1, wherein said resin portion has a window portion through which light emitted from said semiconductor laser chip passes.

6. The semiconductor laser device according to claim 1, wherein an outer circumference of said resin portion is provided with a cut portion for stopping rotation.

7. The semiconductor laser device according to claim 1, wherein said mounting portion in said first lead portion is made wider than said first lead portion excluding said mounting portion.

8. A semiconductor laser device, comprising:
   a first lead portion having a mounting portion, on which a semiconductor laser chip is mounted, and a heat radiation portion extending from said mounting portion;
   a second lead portion for an electrode, the second lead portion having a first side portion disposed to one side of said heat radiation portion and a second side portion disposed to another side of said heat radiation portion;
   a third lead portion for heat radiation having a first side portion disposed to one side of said second lead portion and a second side portion disposed to another side of said second lead portion; and a resin portion fixing said first, second and third lead portions;

wherein said second and third lead portions extend from said resin portion on a same side of the resin portion.

* * * * *